United States Patent
Yu

(10) Patent No.: US 6,274,493 B1
(45) Date of Patent: Aug. 14, 2001

(54) METHOD FOR FORMING A VIA

(75) Inventor: Chia-Chieh Yu, Taipei (TW)

(73) Assignee: United Microelectronics Corp., Hsinchu (TW)

(*) Notice: Subject to any disclaimer, the term of this patent is extended or adjusted under 35 U.S.C. 154(b) by 0 days.

(21) Appl. No.: 09/227,975

(22) Filed: Jan. 8, 1999

(30) Foreign Application Priority Data

Nov. 23, 1998 (TW) .................................. 87119383

(51) Int. Cl.$^7$ .................................................. H01L 21/44
(52) U.S. Cl. ..................... 438/677; 438/694; 438/695; 438/703; 438/706; 438/709; 438/711
(58) Field of Search ..................... 438/677, 631, 438/694, 695, 703, 706, 709, 711, 723, 724, 725, 761; 257/775, 776, 773, 780, 781, 786

(56) References Cited

U.S. PATENT DOCUMENTS

| | | | |
|---|---|---|---|
| 5,818,111 | * 10/1998 | Jeng et al. | 257/776 |
| 5,948,701 | * 9/1999 | Chooi et al. | 438/694 |
| 6,028,367 | * 5/1999 | Yu | 257/780 |

* cited by examiner

Primary Examiner—David Nelms
Assistant Examiner—Reneé R Berry
(74) Attorney, Agent, or Firm—Jiawei Huang; J. C. Patents

(57) ABSTRACT

An improved method of forming a via on a semiconductor substrate forms a conductive line thereon and then forms an inter-metal dielectric layer over the conductive line. A patterned photoresist layer is formed on the inter-metal dielectric layer. A portion of the inter-metal dielectric layer is removed to expose the conductive line using the photoresist layer as a mask to form a via hole, wherein the via hole is subsequently used to form a via. A high density plasma process is performed to remove the photoresist layer. The photoresist layer remaining on the substrate is removed with a solvent.

12 Claims, 2 Drawing Sheets

METHOD FOR FORMING A VIA

CROSS-REFERENCE TO RELATED APPLICATION

This application claims the priority benefit of Taiwan application serial no. 87119383, filed November 23, the full disclosure of which is incorporated herein by reference.

BACKGROUND OF THE INVENTION

1. Field of Invention

The present invention relates to a method of fabricating a via. More particularly, the present invention relates to a method for removing a photoresist layer.

2. Description of Related Art

In order to increase integration of semiconductor devices, multilevel metallization processes are widely used in metal oxide semiconductors (MOS). In a multilevel metallization process, an inter-metal dielectric (IMD) layer is necessarily formed between every two layers of metal for insulation. A via is formed in the inter-metal dielectric layer to electrically couple the metal lines.

However, stacks of a conductive layer/an insulating layer/a conductive layer cause what is known as a parasitic capacitor effect, in which a parasitic capacitor is formed. Thus, RC delay time generated by the parasitic capacitor effect causes a decrease in device operating speed. Therefore in order to lower the parasitic capacitor effect, an insulating layer with a low dielectric constant is provided between every two metal lines. Flowable oxide is commonly used as the insulating material.

One method of forming the inter-metal dielectric layer is to form a conformal barrier oxide layer, a flowable oxide layer and a cap oxide layer over a semiconductor substrate. Additionally, an insulating layer can be formed between the flowable oxide layer and the cap oxide layer. The inter-metal dielectric layer has a low dielectric constant so as to decrease the parasitic capacitor effect.

In a conventional method of forming a via, using a patterned photoresist layer as an etching mask, the inter-metal dielectric layer is etched until the metal line is exposed to form a via hole in the inter-metal dielectric layer. The photoresist layer is removed by oxygen plasma. The substrate is washed with a solvent to remove the photoresist layer remaining on the substrate. While forming the via, the flowable oxide layer is exposed by the via. Therefore during the step of removing the photoresist layer with oxygen plasma, the flowable oxide layer is bombarded by the oxygen plasma. After the substrate is washed with a solvent, the number of Si—H bonding in the flowable oxide layer is decreased and the number of Si—OH bonding is increased.

The increased number of Si—OH bonding leads to an increase in the dielectric constant of the flowable oxide layer so that parasitic capacitor's capacitance is increased. Then, RC delay time is increased, which causes a decrease of device operating speed. In addition, an increased Si—OH bonding causes moisture contained by the flowable oxide to increase. In a later process of filling the via hole with a conductive layer, bubbles are formed from the moisture that exists in the flowable oxide due to the high temperature process; in other words, the bubbles are generated in the via. The bubbles poison the conductive material that fills the via hole, resulting in a poisoned via phenomenon. Thus, the conductive line cannot be electrically coupled, and devices malfunction. Device yield is decreased.

SUMMARY OF THE INVENTION

Accordingly, the present invention provides a method of forming a via, which can avoid an increase in the dielectric constant of an inter-metal dielectric layer generated by the change of the flowable oxide's bonding. It can also avoid generating bubbles in the via. Therefore, a poison phenomenon, which could cause a decrease of the device yield, does not occur.

To achieve these and other advantages and in accordance with the purpose of the invention, as embodied and broadly described herein, the invention provides a method of forming a via on a semiconductor substrate wherein a conductive line is formed thereon and an inter-metal dielectric layer is formed over the conductive line. A patterned photoresist layer is formed on the inter-metal dielectric layer. A portion of the inter-metal dielectric layer is removed to expose the conductive line using the photoresist layer as a mask to form a via hole, wherein the via hole is subsequently used to form a via. A high density plasma process is performed to remove the photoresist layer. A cleaning step with a solvent is performed to remove the photoresist layer remaining on the substrate.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
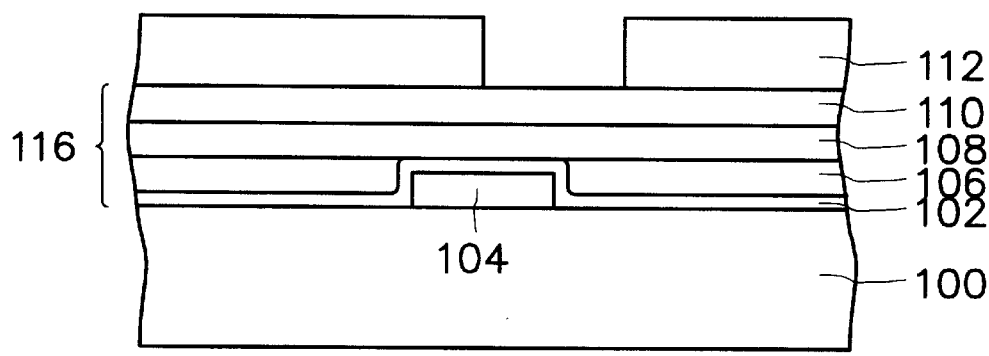
FIGS. 1A through 1C are schematic, cross-sectional views showing a method for forming a via according to one preferred embodiment of this invention.

Reference will now be made in detail to the present preferred embodiments of the invention, examples of which are illustrated in the accompanying drawings. Wherever possible, the same reference numbers are used in the drawings and the description to refer to the same or like parts.

Figure 1B:
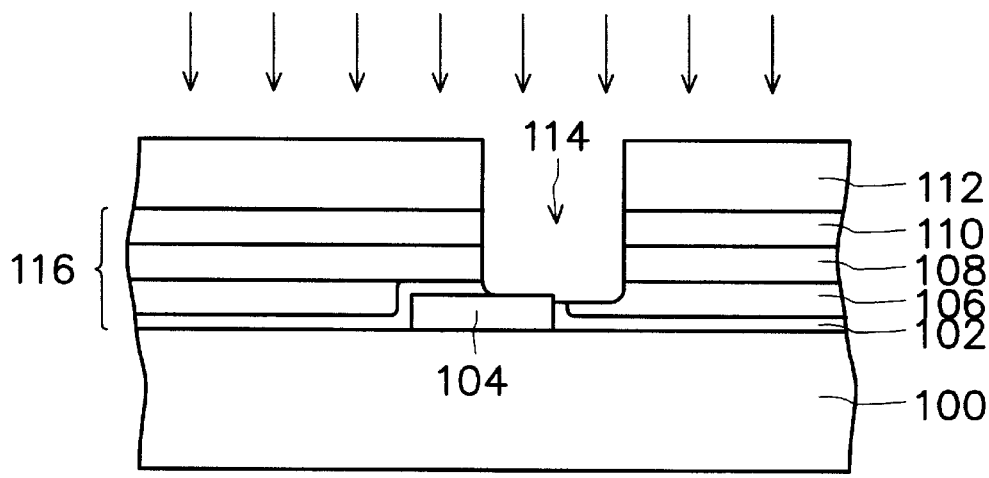
Figure 1C:
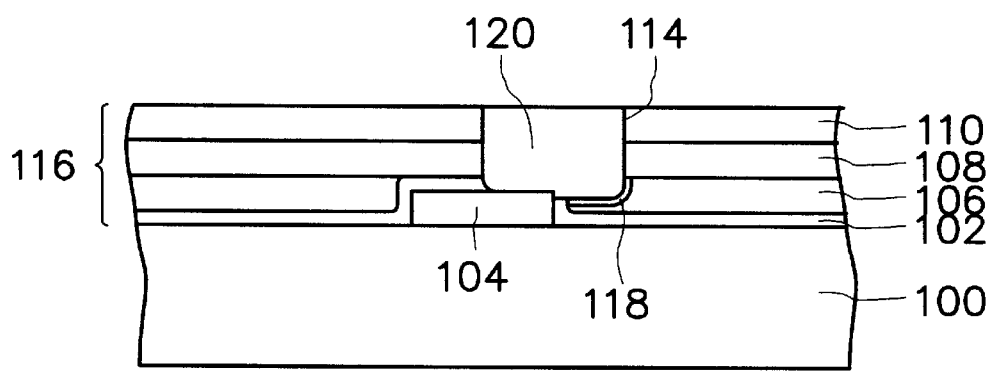

FIGS. 1A through 1C are schematic, cross-sectional views showing a method for forming a via according to one preferred embodiment of this invention As shown in FIG. 1A, a semiconductor substrate 100 is provided. A conductive line 104 is formed over the substrate 100. The conductive line 104 is a part of a structure preformed over the substrate 100. A conformal barrier oxide layer 102 is formed over the conductive line 104. A flowable oxide layer 106 is formed on the barrier oxide layer 102, for example, by coating a flowable oxide material over the substrate 100. An ion implantation is performed on the substrate 100 so that a portion of the flowable oxide layer 106 is converted into a silicon dioxide layer. Thus an isolation layer 108 composed of silicon oxide is formed on the surface of the flowable oxide layer 106. A cap oxide layer 110 is deposited on the isolation layer 108. The barrier oxide layer 102, the flowable oxide layer 106, the isolation layer 108 and the cap oxide layer 110 together are called an inter-metal dielectric layer 116. A patterned photoresist layer 112 is formed on the inter-metal dielectric layer 116.

As shown in FIG. 1B, using the photoresist layer as a mask, the cap oxide layer 110, the isolation oxide layer 108, the flowable oxide layer 106, and the barrier oxide layer 102 are subsequently etched until the conductive line 104 is exposed, for example, by anisotropic etching. Thus a via hole 114 is formed and the barrier oxide layer 102, the flowable oxide layer 106, the isolation layer 108 and the cap oxide layer 110 are also exposed by the via hole 114. A high density plasma process is performed on the substrate 100 to remove the photoresist layer 112.

As shown in FIG. 1C, a cleaning step is performed. The substrate 100 is cleaned with a solvent to remove the photoresist layer 112 remaining on the substrate 100, wherein the solvent includes an alkaline solvent with an amine group, for example. Although a portion of the flowable oxide layer 106 on the via hole's 114 side wall is also bombarded by the plasma, a portion of the flowable oxide layer 106 bombarded by the plasma is converted into a silicon oxide layer as the aforementioned result of ion implantation, so that a passivation layer 118 composed of silicon oxide is formed on the surface of the flowable oxide layer 106. Due to the passivation layer 118, while performing the cleaning step, a decrease of Si—H bonding's number and an increase of Si—OH bonding's number in the flowable oxide layer 106 can be avoided. Therefore, the flowable oxide layer 106 can keep a low dielectric constant and avoid forming a parasitic capacitor generated by multilevel interconnects.

Additionally, since the Si—OH bonding does not exist in the flowable oxide layer 106, the flowable oxide layer 106 does not have any moisture. Therefore, when the via hole 114 is filled with electrically conductive material in a subsequent step, bubbles are not generated in the metal via hole 114 so that a poisoned via phenomenon cannot happen in a subsequently formed via. Thus the quality and yielding of the multilevel interconnects is enhanced. Then a plug 120 is formed in the via hole 114 to form a via over the substrate 100.

Figure 2:
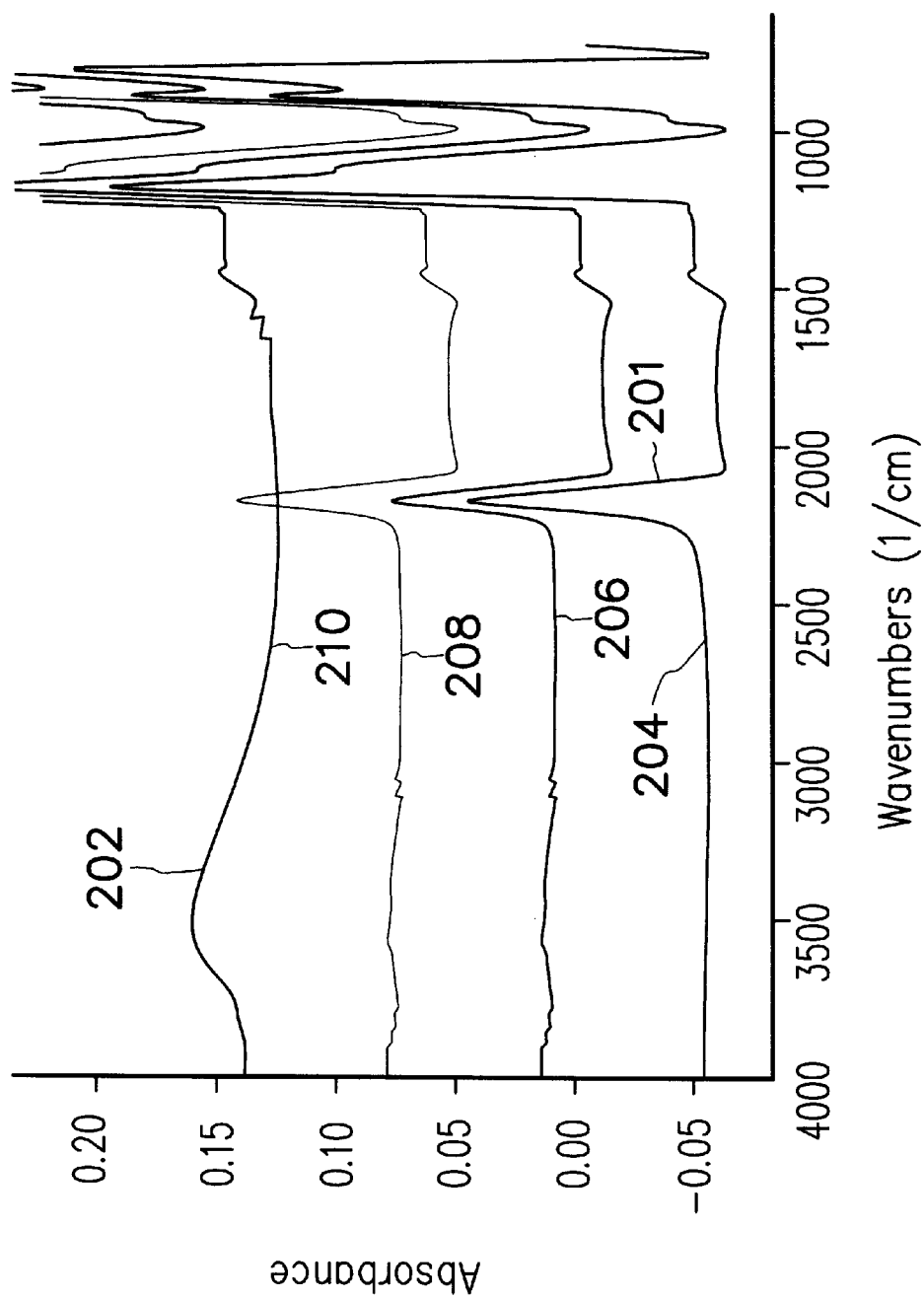
FIG. 2 is FTIR spectra showing flowable oxide in an inter-metal dielectric layer after undergoing different treatments.

FIG. 2 is FTIR spectra showing flowable oxide in an inter-metal dielectric layer after undergoing different treatments.

As shown in FIG. 2, curve 204 is a blank test which represents FTIIR spectra of a flowable oxide layer before the photoresist layer is removed. Curve 206 is FTIR spectra of a flowable oxide layer before being washed with a solvent after the photoresist layer is removed by high density oxygen plasma according to the preferred embodiment of this invention. Curve 208 is FTIR spectra of a flowable oxide layer washed with a solvent after the photoresist layer is removed by high density oxygen plasma according to the preferred embodiment of this invention. Curve 210 is FTIR spectra of a flowable oxide layer before being washed with a solvent after the photoresist layer is removed by oxygen plasma according to a conventional method. Absorption peak 201 represents absorption peak of Si—H bonding with wave numbers of about 2300 $cm^{-1}$. Absorption peak 202 represents absorption peak of Si—OH bonding with wave numbers of about 3500 $cm^{-1}$.

Still referring to FIG. 2, compared between curve 204 and curve 210, the figure shows that after the photoresist layer is removed by oxygen plasma in the conventional method, the number of Si—H bonding in the flowable oxide layer washed with a solvent is obviously decreased. Therefore the dielectric constant of the flowable oxide layer is increased, and the parasitic capacitor's capacitance is thus increased. It is also shown that Si—OH bonding in the flowable oxide layer washed with a solvent is increased; in other words, some moisture exists in the flowable oxide layer washed with a solvent after the photoresist layer is removed by high density oxygen plasma. Thus while subsequently forming a via, the via hole 114 (FIG. 1) is not filled with a conductive layer and does not lead to a poisoned via phenomenon.

Comparing curve 204 and curve 208, it is shown that the number of Si—H bonding in the flowable oxide layer washed with a solvent is not decreased after the photoresist layer is removed by high density oxygen plasma, and Si—OH bonding is scarcely generated. This means that after the photoresist layer is removed, the flowable oxide layer in the invention has a low dielectric constant so that the parasitic capacitor effect is avoided. Moisture is not generated in the flowable oxide layer. Thus, the poisoned via phenomenon does not occur in a later process.

Comparing curve 206 and curve 208, it is shown that after the photoresist layer is removed by high density oxygen plasma, the number of Si—H bonding in the flowable oxide layer washed with a solvent is the same as that in the one that is not washed with a solvent. This means that the flowable oxide layer performed by high density plasma has better solvent resistance because the high density plasma converts the flowable oxide layer and a passivation layer 118 (FIG. 1C) is formed on the flowable oxide layer. Thus the number of Si—H bonding is not changed in the flowable oxide layer through a cleaning step and is not converted into Si—OH bindings.

In summary, the invention is to perform the high density plasma process to remove the photoresist layer. Then the substrate is washed with a solvent having an amine group to remove the photoresist layer remaining on the substrate. Thus the flowable oxide layer in the invention can keep a low dielectric constant and is not damaged by the solvent. Moisture is not generated in the flowable oxide layer, and the poisoned via phenomenon does not occur in a later process.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of forming a via on a semiconductor substrate, wherein a conductive line is formed on the substrate and an inter-metal dielectric layer is formed over the conductive line, the method comprising:

forming a patterned photoresist layer on the inter-metal dielectric layer;

removing a portion of the inter-metal dielectric layer to expose the conductive line using the photoresist layer as a mask to form a via hole wherein the via hole is subsequently used to form a via;

performing a high density oxygen plasma process to remove the photoresist layer and simultaneously form a passivation layer; and performing a cleaning step with a solvent to remove the photoresist layer remaining on the substrate.

2. The method of claim 1, wherein a portion of the inter-metal dielectric layer is removed by anisotropic etching.

3. The method of claim 1, wherein the inter-metal dielectric layer comprises a flowable oxide layer.

4. The method of claim 1, wherein the solvent includes an alkaline solvent with an amine group.

5. The method of claim 1, wherein the inter-metal dielectric layer comprises a barrier oxide layer.

6. The method of claim 1, wherein the inter-metal dielectric layer includes an isolation layer.

7. The method of claim 6, wherein the isolation layer is formed by ion implantation which converts the flowable oxide layer into a silicon oxide layer.

8. The method of claim 1, wherein the inter-metal dielectric layer includes a cap oxide layer.

9. A method of removing a photoresist layer over a substrate, comprising the step of:

performing a high density oxygen plasma process to remove the photoresist layer and simultaneously form a passivation layer; and performing a cleaning step with an alkaline solvent which containing amine group to remove the photoresist layer remaining on the substrate.

10. A method of forming a via over a substrate, comprising:

forming a conductive line over the substrate;

forming a conformal barrier oxide layer on the conductive line;

forming a flowable oxide layer on the barrier oxide layer;

forming an isolation layer on the flowable oxide layer;

forming a cap oxide layer on the isolation layer;

forming a patterned photoresist layer on the cap oxide layer;

etching the cap oxide layer, the isolation layer, the flowable oxide layer, and the barrier oxide layer until the conductive line is exposed using the photoresist layer as a mask to form a via hole, wherein the via hole is subsequently used to form a via;

performing a high density oxygen plasma process to remove the photoresist layer and simultaneously form a passivation layer; and performing a cleaning step with a solvent to remove the photoresist layer remaining on the substrate.

11. The method of claim 10, wherein the solvent comprises an alkaline solvent having an amine group.

12. The method of claim 10, wherein the isolation layer is formed by ion implantation which converts the flowable oxide layer into a silicon oxide layer.

* * * * *